United States Patent
Hu

(10) Patent No.: US 9,741,752 B1
(45) Date of Patent: Aug. 22, 2017

(54) METHOD FOR MANUFACTURING TFT SUBSTRATE

(71) Applicant: Wuhan China Star Optoelectronics Technology Co., Ltd., Wuhan (CN)

(72) Inventor: Junyan Hu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/196,048

(22) Filed: Jun. 29, 2016

(30) Foreign Application Priority Data

Mar. 31, 2016  (CN) .......................... 2016 1 0202940

(51) Int. Cl.
*H01L 21/00* (2006.01)
*H01L 27/12* (2006.01)
*H01L 29/24* (2006.01)
*H01L 29/786* (2006.01)

(52) U.S. Cl.
CPC ........ *H01L 27/1288* (2013.01); *H01L 27/127* (2013.01); *H01L 27/1225* (2013.01); *H01L 29/247* (2013.01); *H01L 29/78693* (2013.01)

(58) Field of Classification Search
CPC ............. H01L 27/1288; H01L 27/1225; H01L 29/786; H01L 27/3262; H01L 27/3276; H01L 29/04; H01L 29/78606; H01L 29/7869; H01L 21/02554; H01L 21/02565
USPC ........................ 438/104, 164; 257/40, 43, 57
See application file for complete search history.

(56) References Cited

U.S. PATENT DOCUMENTS

| | | | | |
|---|---|---|---|---|
| 9,269,796 B2* | 2/2016 | Yu | ...................... | H01L 29/41733 |
| 2006/0008955 A1* | 1/2006 | Sera | ..................... | H01L 27/1214 |
| | | | | 438/163 |
| 2013/0001564 A1* | 1/2013 | Choi | ................... | H01L 27/3276 |
| | | | | 257/59 |
| 2013/0302939 A1* | 11/2013 | Liu | .................. | H01L 29/66969 |
| | | | | 438/104 |
| 2014/0191228 A1* | 7/2014 | Jung | ................... | H01L 29/7869 |
| | | | | 257/43 |
| 2014/0197415 A1* | 7/2014 | You | ....................... | H01L 27/124 |
| | | | | 257/59 |
| 2015/0303221 A1* | 10/2015 | Ning | ................... | H01L 27/1225 |
| | | | | 257/72 |
| 2017/0018581 A1* | 1/2017 | Xiao | ................... | H01L 27/1288 |

* cited by examiner

*Primary Examiner* — Caleb Henry
(74) *Attorney, Agent, or Firm* — Leong C. Lei

(57) ABSTRACT

Disclosed is a method for manufacturing a TFT substrate, which uses one partial transmitting mask to form patterns of an active layer, a gate insulation layer, and a gate electrode through photolithography such that the entire process for manufacturing TFT substrate can be completely conducted by using only three masks. Compared to the prior art, one mask is save so that the operation is simplified and the manufacturing cost is reduced.

10 Claims, 13 Drawing Sheets

METHOD FOR MANUFACTURING TFT SUBSTRATE

BACKGROUND OF THE INVENTION

1. Field of the Invention

The present invention relates to the field of display technology, and in particular to a method for manufacturing a thin-film transistor (TFT) substrate.

2. The Related Arts

With the progress of the display technology, flat panel display devices, such as liquid crystal displays (LCDs), due to various advantages, such as high image quality, low power consumption, thin device body, and wide range of applications, have been widely used in all sorts of consumer electronic products, including mobile phones, televisions, personal digital assistants (PDAs), digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that liquid crystal molecules are disposed between two parallel glass substrates and multiple vertical and horizontal tiny conductive wires are arranged between the two glass substrates, wherein the liquid crystal molecules are controlled to change directions through application of electricity in order to refract out light emitting from the backlight module to generate an image.

The liquid crystal display panel is generally made up of a color filter (CF) substrate, a thin-film transistor (TFT) substrate, liquid crystal (LC) interposed between the CF substrate and the TFT substrate, and sealant and is generally manufactured with a process involving an anterior stage of array engineering (for thin film, photolithography, etching, and film peeling), an intermediate stage of cell engineering (for lamination of the TFT substrate and the CF substrate), and a posterior stage of module assembly (for combining a drive integrated circuit (IC) and a printed circuit board). Among these stages, the anterior stage of array engineering generally involves the formation the TFT substrate for controlling the movement of liquid crystal molecules; the intermediate stage of cell engineering generally involves filling liquid crystal between the TFT substrate and the CF substrate; and the posterior stage of module assembly generally involves the combination of the drive IC and the printed circuit board for driving the liquid crystal molecules to rotate for displaying of images.

An amorphous In—Ga—Zn—O (a-IGZO) thin-film transistor (TFT) has various advantages, including high electron mobility, low leakage current, and low manufacturing temperature, has attracted wide attention. A conventional bottom gate structure based oxide semiconductor transistor, due to a relatively large overlapping area between a gate electrode and a source electrode thereof, may generate relatively large parasitic capacitance, which leads to delay of signals, and, in addition, a transistor so manufactured shows a relatively large size, imposing constraints to the applications thereof. A top gate self-alignment structure has no overlapping between the source/drain electrode and the gate electrode and thus shows reduced parasitic capacitance and bettered malleability.

As shown in FIGS. 1-7, a convention process for manufacturing a top-gate self-alignment oxide thin-film transistor substrate is shown, comprising the following steps:

Step 1: as shown in FIG. 1, providing a base plate 100 and depositing a buffer layer 200 on the base plate 100;

Step 2: as shown in FIGS. 2-3, depositing a semiconductor layer 300 on the buffer layer 200 and using one mask to subject the semiconductor layer 300 to patterning treatment so as to form an active layer 350;

Step 3: as shown in FIG. 4, depositing, in sequence, an insulation layer 400 and a gate metal layer 500 on the active layer 350 and the buffer layer 200, coating a layer of photoresist material on the gate metal layer 500, and using one mask to subject the layer of photoresist material to patterning treatment so as to form a photoresist layer 600 corresponding to a middle portion of the active layer 350;

Step 4: as shown in FIG. 5, subjecting the gate metal layer 500 and the insulation layer 400 to etching with the photoresist layer 600 as a blocking layer so as to form a gate electrode 550 and a gate insulation layer 450; and subjecting the active layer 350 to treatment, with the photoresist layer 600, the gate electrode 550, and the gate insulation layer 450 as a blocking layer, so as to form a source contact zone 310, a drain contact zone 320, and a channel zone 330 located between the source contact zone 310 and the drain contact zone 320;

Step 5: as shown in FIG. 6, depositing an interlayer dielectric layer 700 on the gate electrode 550, the active layer 350, and the buffer layer 200, and using one mask to subject the interlayer dielectric layer 700 to patterning treatment so as to form, in the interlayer dielectric layer 700, a first via 710 and a second via 720 respectively corresponding to the source contact zone 310 and the drain contact zone 320;

Step 6: as shown in FIG. 7, depositing a source/drain metal layer on the interlayer dielectric layer 700, and using one mask to subject the source/drain metal layer to patterning treatment so as to form a source electrode 810 and a drain electrode 820, wherein the source electrode 810 and the drain electrode 820 are respectively in contact engagement with the source contact zone 310 and the drain contact zone 320 of the active layer 350 through the first via 710 and the second via 720 thereby forming a top-gate self-alignment oxide thin-film transistor substrate.

In the above-described process for manufacturing a top-gate self-alignment oxide thin-film transistor substrate, four masks are needed so that the manufacturing time is extended, the process is complicated, and the manufacturing cost is high.

SUMMARY OF THE INVENTION

An object of the present invention is to provide a method for manufacturing a thin-film transistor (TFT) substrate, which reduces the number of masks used and has a simple process and manufacturing cost.

To achieve the above object, the present invention provides a method for manufacturing a TFT substrate, which comprises the following steps:

(1) providing a base plate and depositing, in sequence, a buffer layer, a semiconductor layer, an insulation layer, and a gate metal layer on the base plate;

(2) coating a layer of photoresist material on the gate metal layer and subjecting the layer of photoresist material to patterning treatment by using a partial transmitting mask so as to form a center-raised-side-recessed photoresist layer, wherein the photoresist layer comprises a first photoresist segment located at a central portion and second photoresist segments respectively located at two opposite sides of the first photoresist segment with a thickness of the first photoresist segment being greater than a thickness of the second photoresist segments;

(3) applying a first etching operation to remove portions of the gate metal layer and the insulation layer that are not covered by the photoresist layer; and applying a second etching operation to remove a portion of the semiconductor layer that is not covered by the photoresist layer to form an active layer;

(4) subjecting the photoresist layer to an ashing operation so as to thin the first photoresist segment and remove the second photoresist segments;

applying an etching operation to remove portions of the gate metal layer and the insulation layer that are not covered by the photoresist layer so as to form a gate electrode and a gate insulation layer; and applying treatment to the active layer, with the photoresist layer, the gate electrode, and the gate insulation layer as a blocking layer, so as to enhance electrical conductivity of portions of the active layer that are not covered by the gate electrode and the gate insulation layer to form a source contact zone, a drain contact zone, and a channel zone that is located between the source contact zone and the drain contact zone;

(5) removing a remaining portion of the photoresist layer and depositing an interlayer dielectric layer on the gate electrode, the active layer, and the buffer layer and subjecting the interlayer dielectric layer to patterning treatment by using one mask so as to form, in the interlayer dielectric layer, a first via and a second via respectively corresponding to the source contact zone and the drain contact zone; and (6) depositing a source/drain metal layer on the interlayer dielectric layer, subjecting the source/drain metal layer to patterning treatment by using one mask so as to form a source electrode and a drain electrode, wherein the source electrode and the drain electrode are respectively in contact engagement with the source contact zone and the drain contact zone of the active layer through the first via and the second via thereby forming a TFT substrate.

In step (2), the thickness of the first photoresist segment is 1.5-3 µm and the thickness of the second photoresist segments is 0.15-1 µm.

In step (2), the photoresist material is a positive photoresist and the partial transmitting mask comprises a non-light-transmitting zone corresponding to the first photoresist segment and partial light-transmitting zones respectively corresponding to the second photoresist segments.

In step (2), the partial transmitting mask is a gray tone mask or a half tone mask.

In step (3), the first etching operation is a dry etching operation and the second etching operation is a wet etching operation; and in step (4), the etching operation is a dry etching operation In step (4), the treatment applied to the semiconductor layer is irradiation with ultraviolet light or plasma treatment.

The plasma comprises hydrogen, ammonia, or argon plasma.

In step (1), the base plate is first washed and cleaned before the buffer layer is deposited on the base plate.

In step (1), a material of the semiconductor layer is amorphous indium gallium zinc oxide and the semiconductor layer is formed through deposition in room temperature with sputtering equipment.

The base plate (10) comprises a glass plate. The buffer layer and the interlayer dielectric layer are each a silicon oxide layer, a silicon nitride layer, or a composite layer formed of a silicon oxide layer and a silicon nitride layer stacked on each other. The gate insulation layer is formed of a material comprising silicon oxide. The gate electrode, the source electrode, and the drain electrode are each formed of a material comprising one of molybdenum, titanium, aluminum, and copper, or a stacked combination of multiple ones thereof.

The efficacy of the present invention is that the present invention provides a method for manufacturing a TFT substrate, which uses one partial transmitting mask to form patterns of an active layer, a gate insulation layer, and a gate electrode through photolithography such that the entire process for manufacturing TFT substrate can be completely conducted by using only three masks. Compared to the prior art, one mask is save so that the operation is simplified and the manufacturing cost is reduced.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
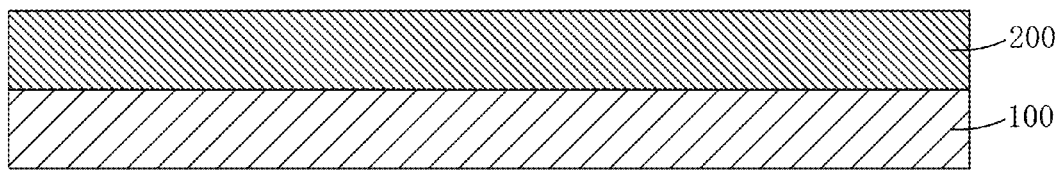
FIG. 1 is a schematic views illustrating step 1 of a conventional process for manufacturing a top-gate self-alignment oxide semiconductor thin-film transistor (TFT) substrate.
Figure 2:
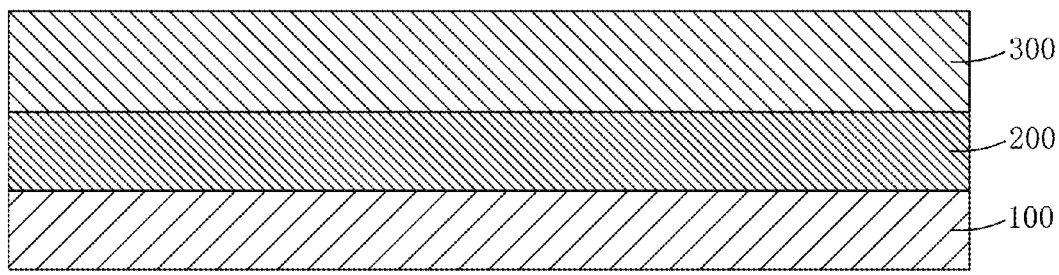
FIGS. 2 and 3 are schematic views illustrating step 2 of the conventional process for manufacturing a top-gate self-alignment oxide semiconductor TFT substrate.
Figure 3:
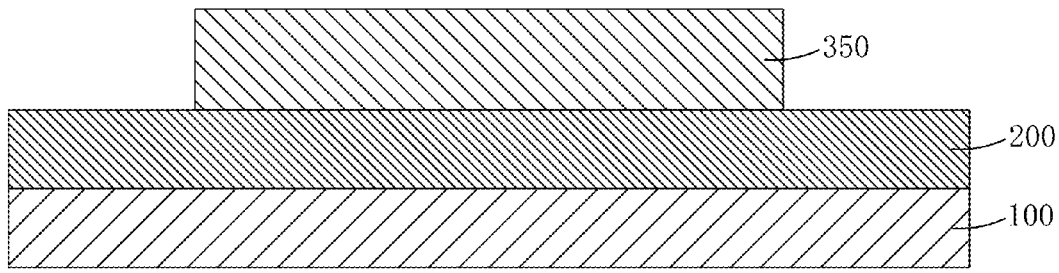
Figure 4:
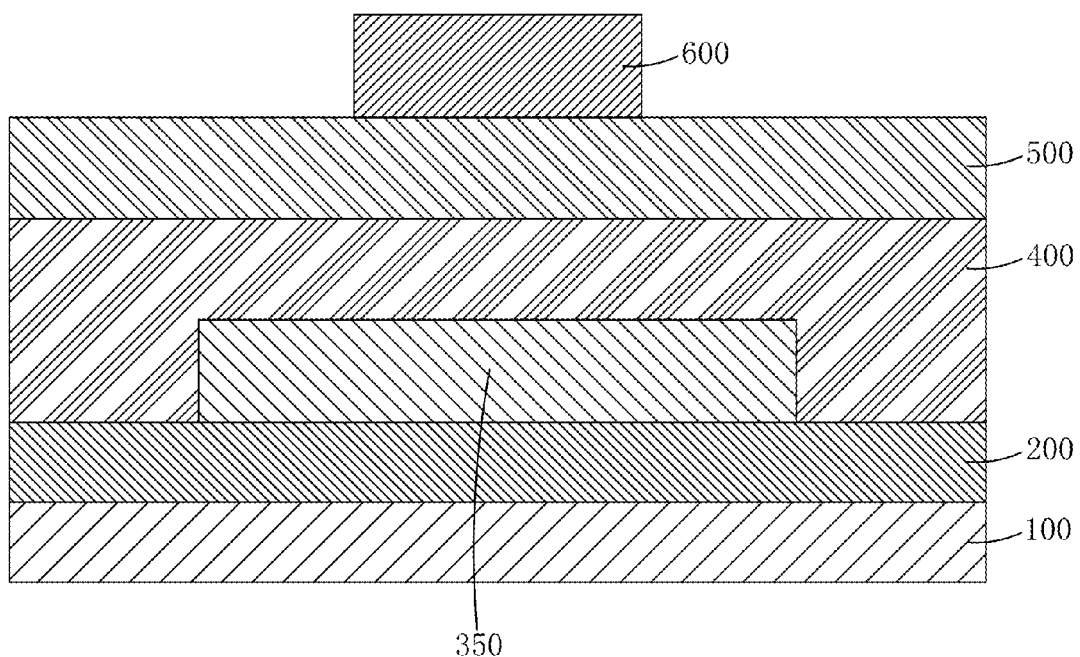
FIG. 4 is a schematic view illustrating step 3 of the conventional process for manufacturing a top-gate self-alignment oxide semiconductor TFT substrate.
Figure 5:
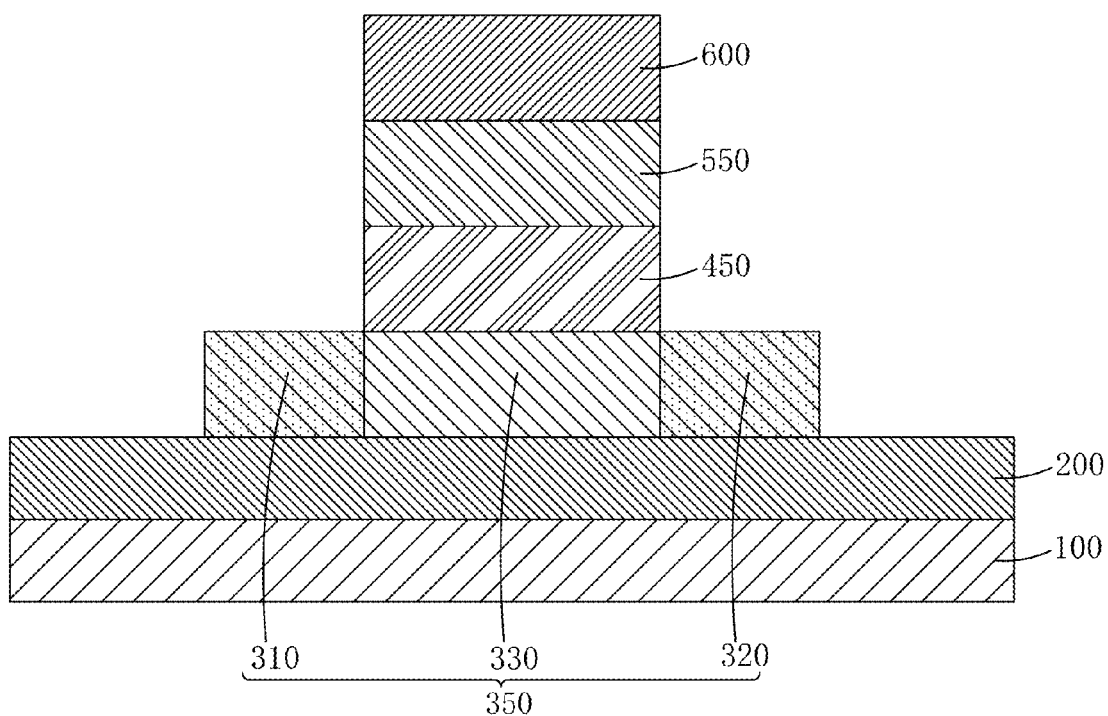
FIG. 5 is a schematic view illustrating step 4 of the conventional process for manufacturing a top-gate self-alignment oxide semiconductor TFT substrate.
Figure 6:
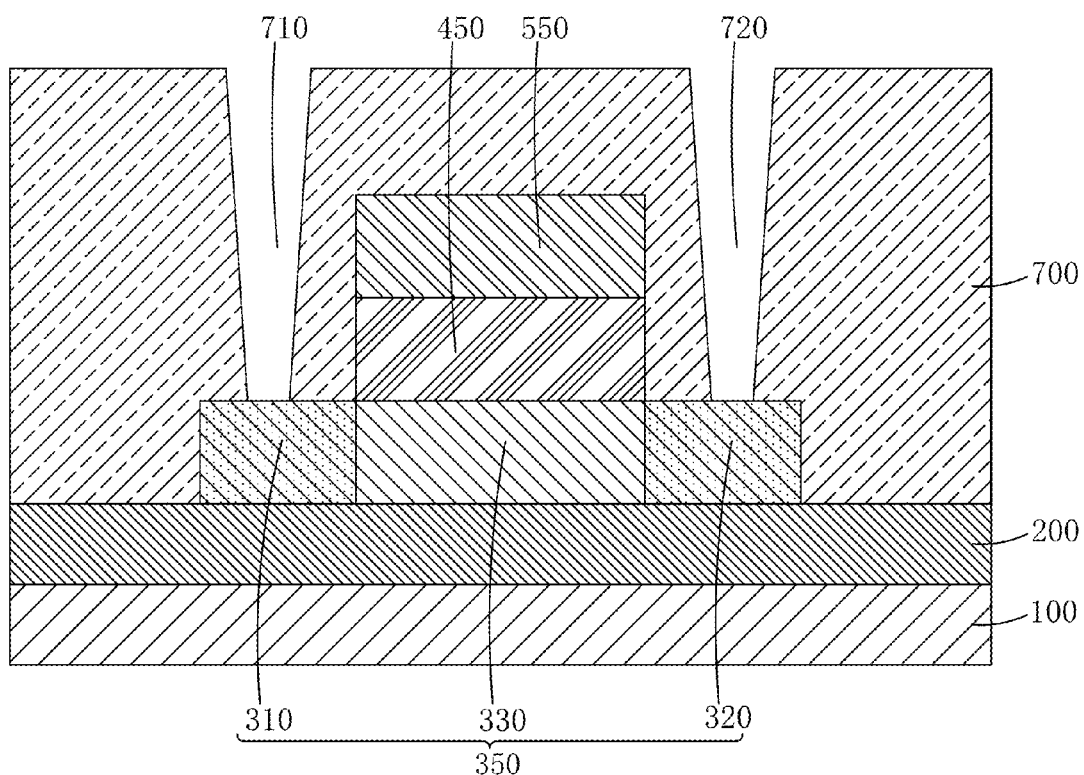
FIG. 6 is a schematic view illustrating step 5 of the conventional process for manufacturing a top-gate self-alignment oxide semiconductor TFT substrate.
Figure 7:
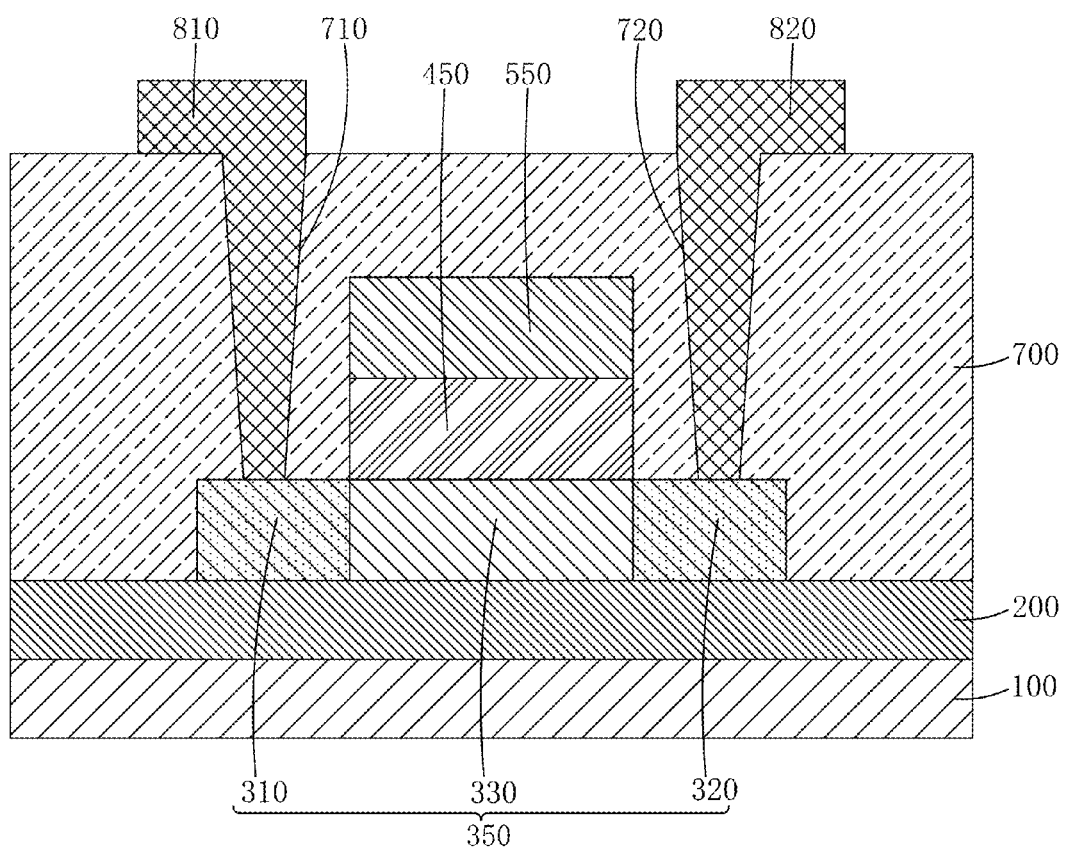
FIG. 7 is a schematic view illustrating step 6 of the conventional process for manufacturing a top-gate self-alignment oxide semiconductor TFT substrate.
Figure 8:
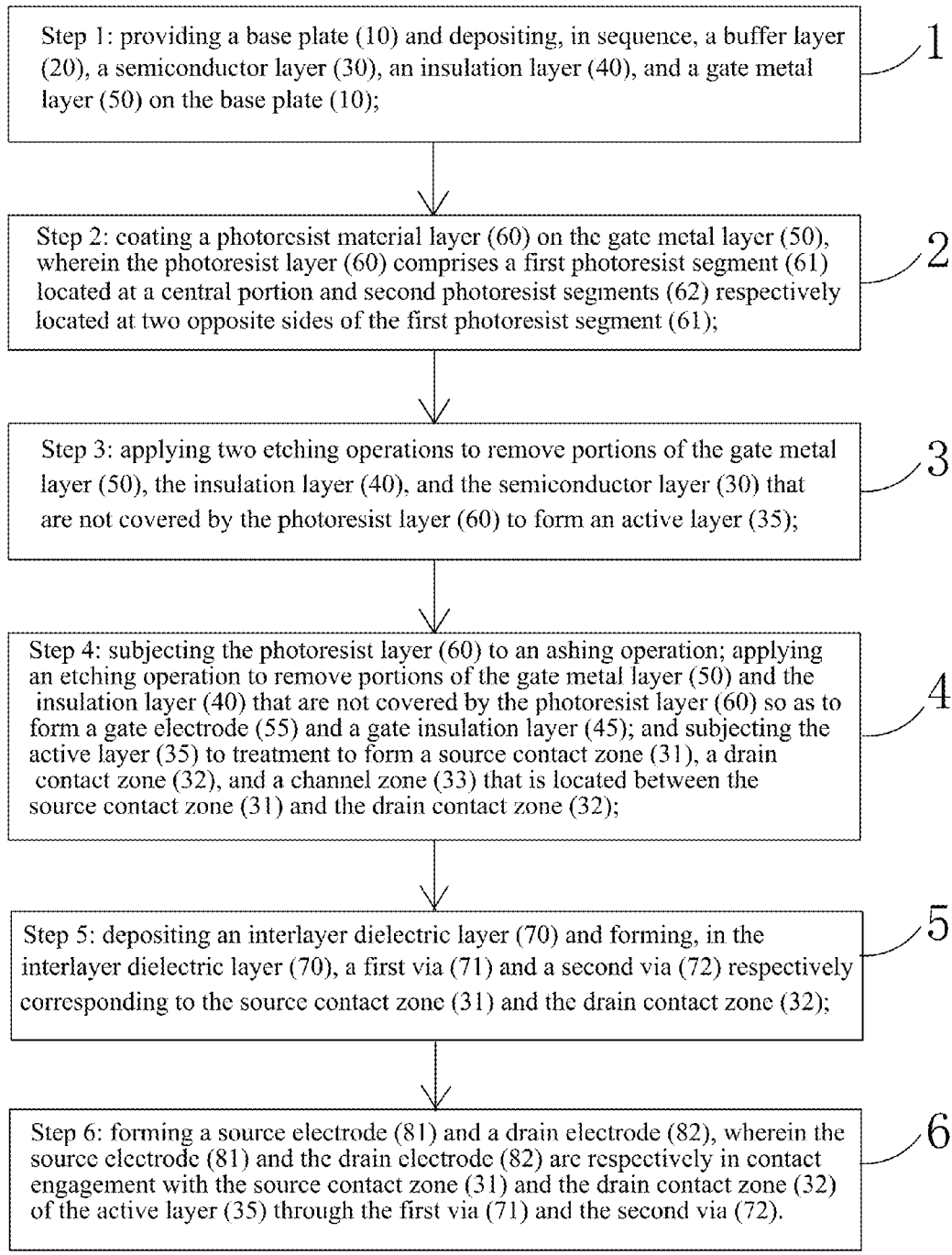
FIG. 8 is a flow chart illustrating a method for manufacturing a TFT substrate according to the present invention.
Figure 9:
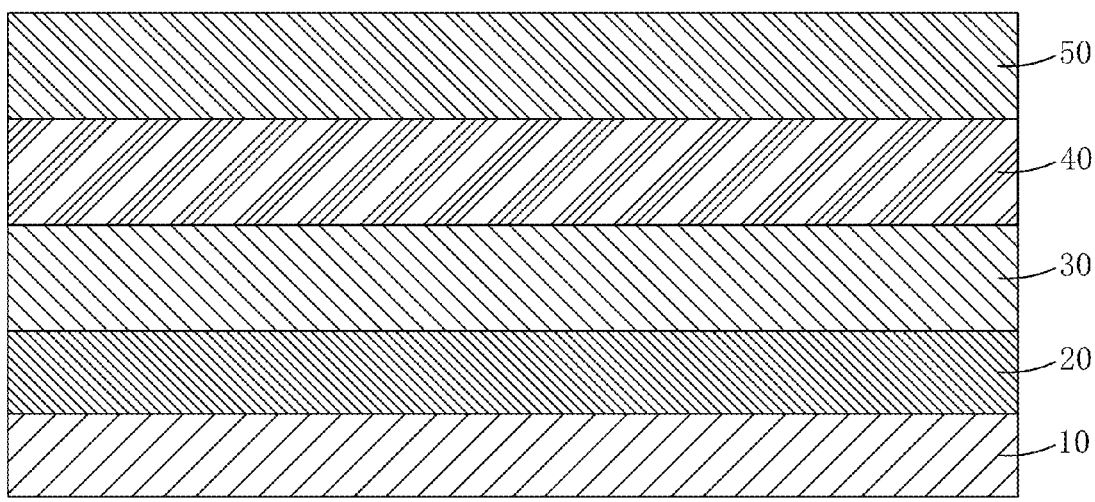
FIG. 9 is a schematic view illustrating step 1 of the method for manufacturing a TFT substrate according to the present invention.

Referring to FIG. 8, the present invention provides a method for manufacturing a thin-film transistor (TFT) substrate, which comprises the following steps:

Step 1: as shown in FIG. 9, providing a base plate 10 and depositing, in sequence, a buffer layer 20, a semiconductor layer 30, an insulation layer 40, and a gate metal layer 50 on the base plate 10.

Specifically, in Step 1, the base plate 10 is first washed and cleaned before the buffer layer 20 is deposited on the base plate 10.

Specifically, the base plate 10 comprises a transparent plate, preferably a glass plate.

Specifically, the buffer layer 20 is a silicon oxide ($SiO_x$) layer, a silicon nitride ($SiN_x$) layer, or a composite layer formed of a silicon oxide layer and a silicon nitride layer stacked on each other.

A material of the semiconductor layer 30 is amorphous indium gallium zinc oxide (IGZO), and the semiconductor layer 30 is formed through deposition in room temperature with sputtering equipment.

Figure 10:
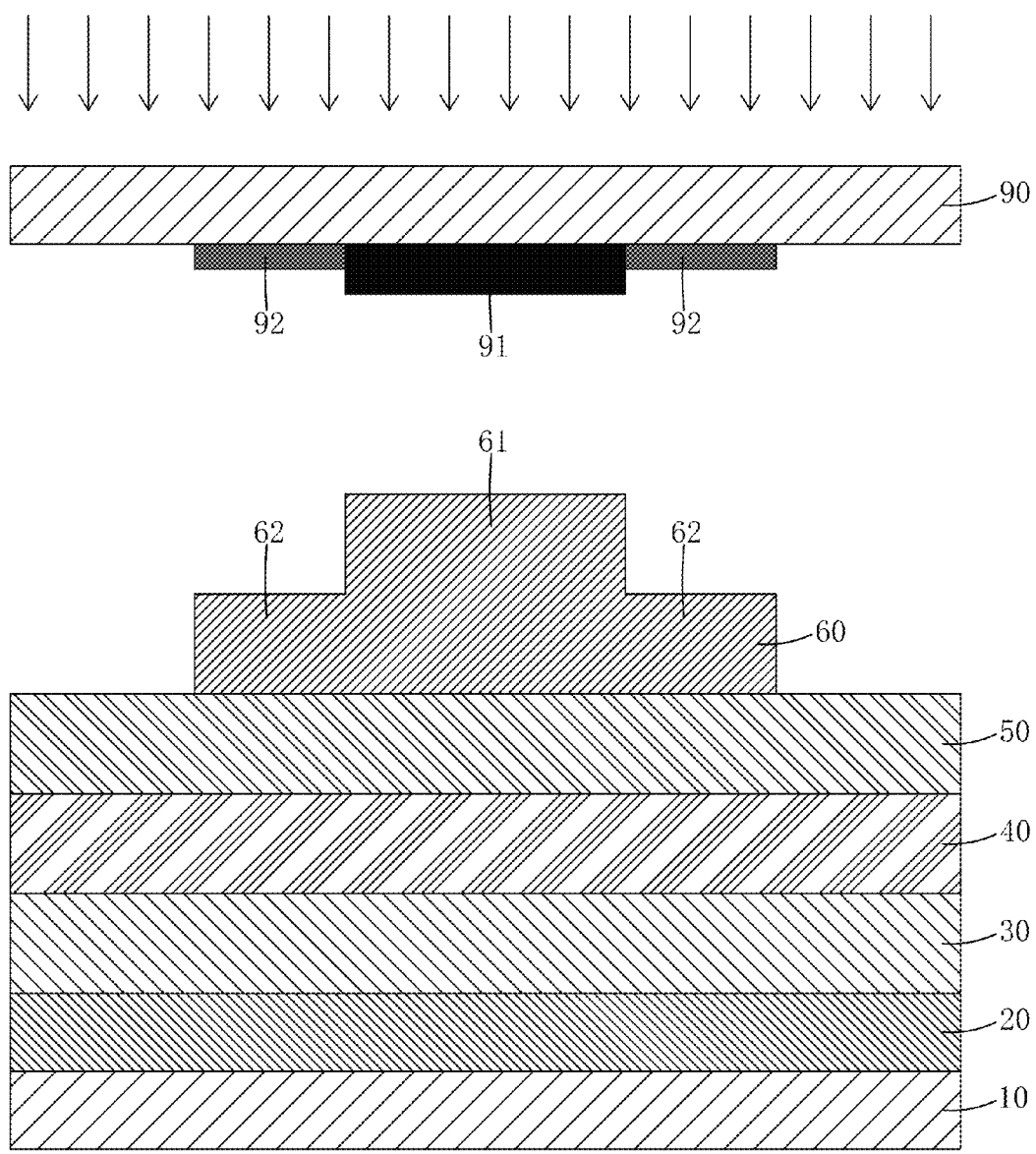
FIG. 10 is a schematic view illustrating step 2 of the method for manufacturing a TFT substrate according to the present invention.

Step 2: as shown in FIG. 10, coating a layer of photoresist material on the gate metal layer 50 and subjecting the layer of photoresist material to patterning treatment by using a partial transmitting mask 90 so as to form a center-raised-side-recessed photoresist layer 60, wherein the photoresist layer 60 comprises a first photoresist segment 61 located at a central portion and second photoresist segments 62 respectively located at two opposite sides of the first photoresist segment 61 with a thickness of the first photoresist segment 61 being greater than a thickness of the second photoresist segments 62.

Specifically, the thickness of the first photoresist segment 61 is 1.5-3 μm, and the thickness of the second photoresist segments 62 is 0.15-1 μm.

Specifically, the photoresist material is a positive photoresist and the partial transmitting mask 90 comprises a non-light-transmitting zone 91 corresponding to the first photoresist segment 61 and partial light-transmitting zones 92 respectively corresponding to the second photoresist segments 62.

Specifically, the partial transmitting mask 55 can be a gray tone mask (GTM) or a half tone mask (HTM).

Figure 11:
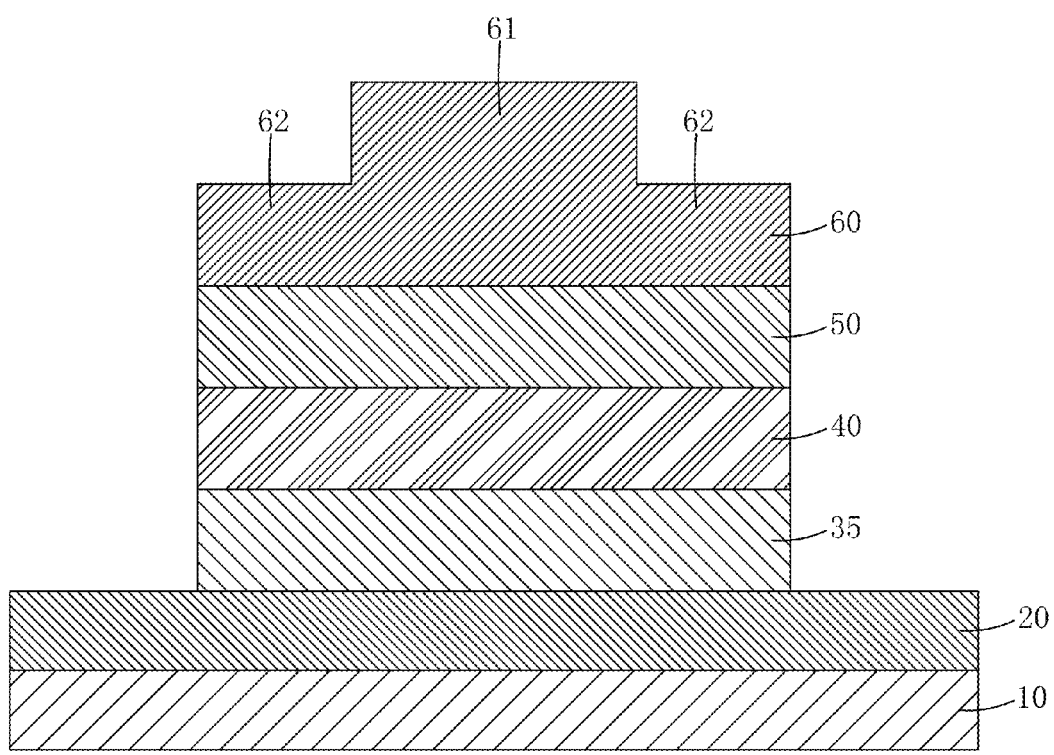
FIG. 11 is a schematic view illustrating step 3 of the method for manufacturing a TFT substrate according to the present invention.

Step 3: as shown in FIG. 11, applying a first etching operation to remove portions of the gate metal layer 50 and the insulation layer 40 that are not covered by the photoresist layer 60; and applying a second etching operation to remove a portion of the semiconductor layer 30 that is not covered by the photoresist layer 60 to form an active layer 35.

Specifically, in Step 3, the first etching operation used is a dry etching operation, and the second etching operation used is a wet etching operation.

Figure 12:
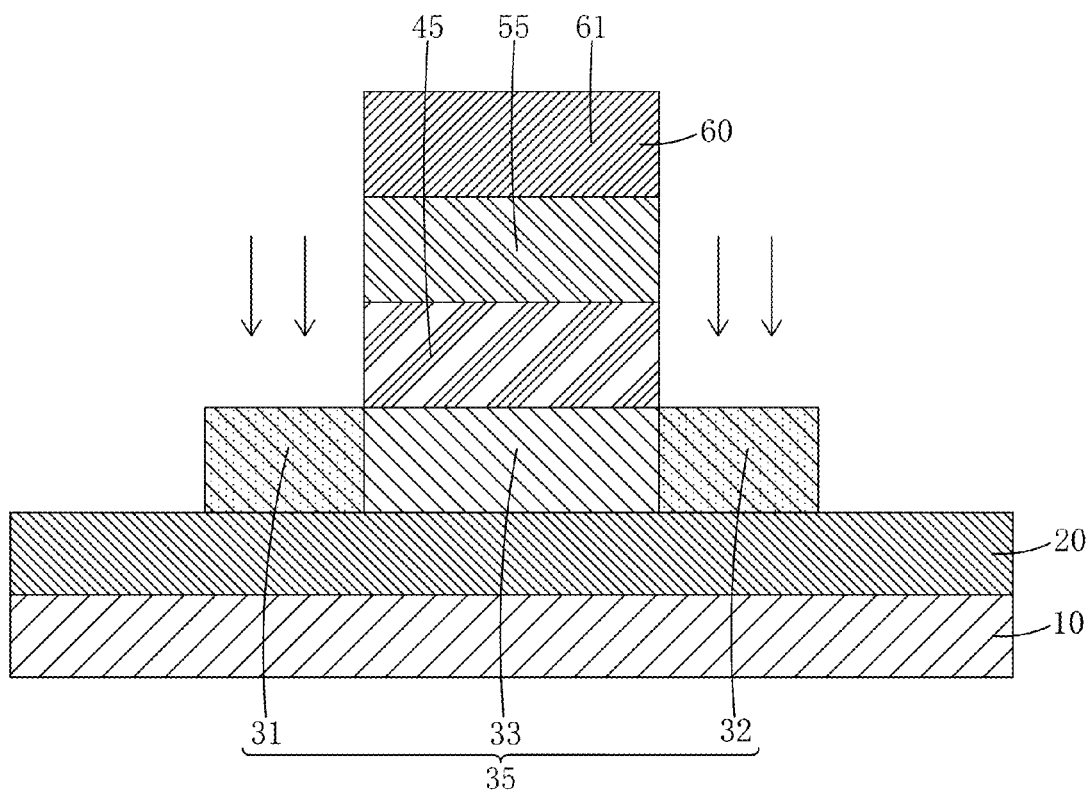
FIG. 12 is a schematic view illustrating step 4 of the method for manufacturing a TFT substrate according to the present invention.

Step 4: as shown in FIG. 12, subjecting the photoresist layer 60 to an ashing operation so as to thin the first photoresist segment 61 and remove the second photoresist segments 62;

applying an etching operation to remove portions of the gate metal layer 50 and the insulation layer 40 that are not covered by the photoresist layer 60 so as to form a gate electrode 55 and a gate insulation layer 45; and applying treatment to the active layer 35, with the photoresist layer 60, the gate electrode 55, and the gate insulation layer 45 as a blocking layer, so as to enhance electrical conductivity of portions of the active layer 35 that are not covered by the gate electrode 55 and the gate insulation layer 45 to form a source contact zone 31, a drain contact zone 32, and a channel zone 33 that is located between the source contact zone 31 and the drain contact zone 32.

Specifically, in Step 4, the treatment applied to the semiconductor layer 30 is irradiation with ultraviolet light (UV) or plasma treatment. Specifically, the plasma used can be hydrogen, ammonia, or argon plasma.

Specifically, in Step 4, the etching operation used is a dry etching operation.

Figure 13:
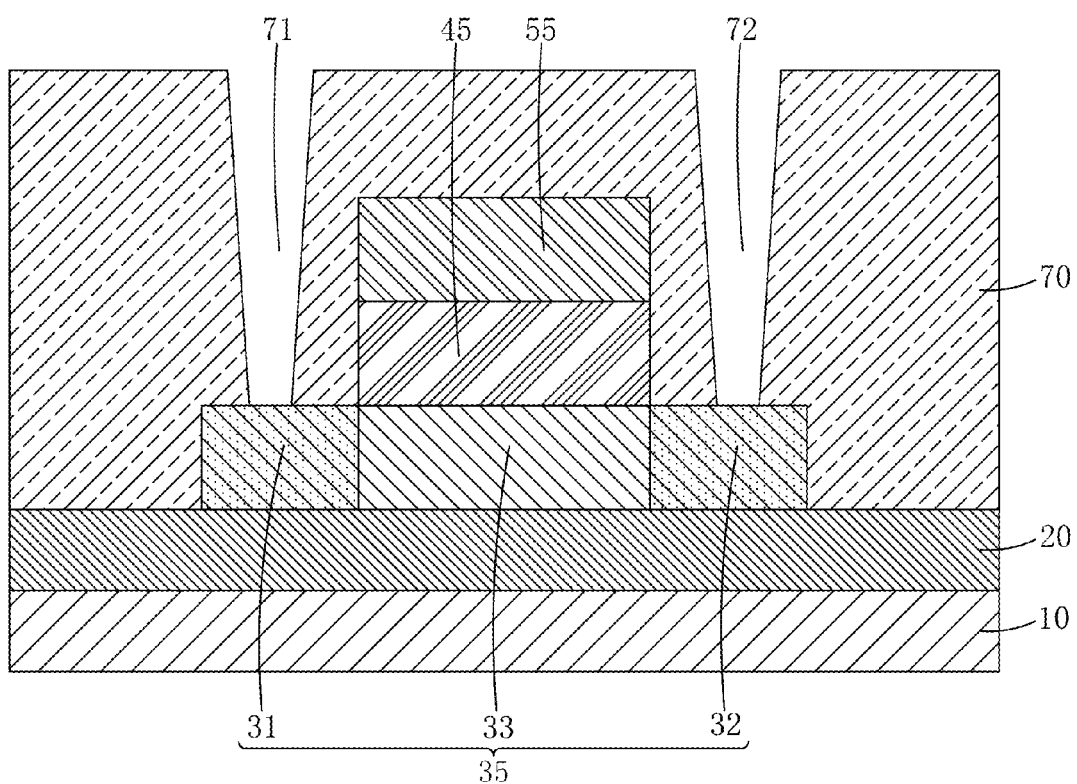
FIG. 13 is a schematic view illustrating step 5 of the method for manufacturing a TFT substrate according to the present invention.

Step 5: as shown in FIG. 13, removing a remaining portion of the photoresist layer 60 and depositing an interlayer dielectric layer 70 on the gate electrode 55, the active layer 35, and the buffer layer 20 and subjecting the interlayer dielectric layer 70 to patterning treatment by using one mask so as to form, in the interlayer dielectric layer 70, a first via 71 and a second via 72 respectively corresponding to the source contact zone 31 and the drain contact zone 32.

Specifically, the interlayer dielectric layer 70 comprises a silicon oxide ($SiO_x$) layer, a silicon nitride ($SiN_x$) layer, or a composite layer formed of a silicon oxide layer and a silicon nitride layer stacked on each other.

Figure 14:
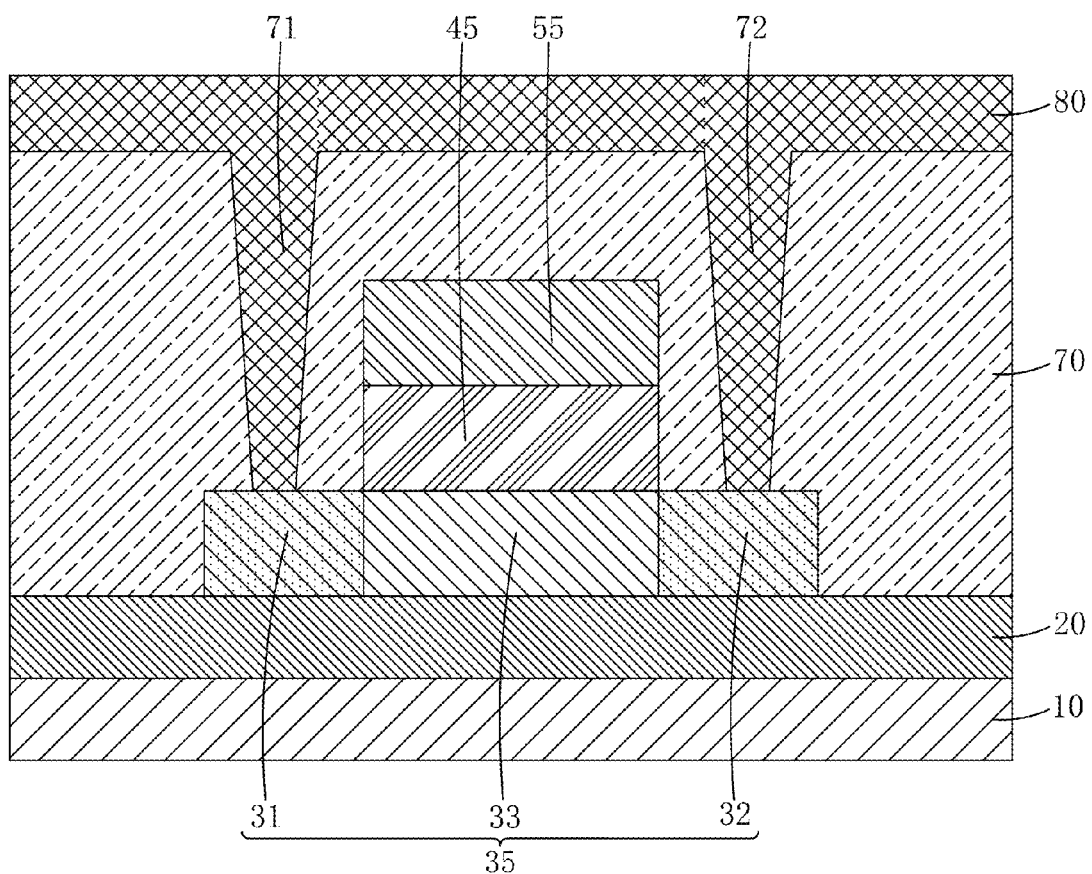
FIGS. 14-15 are schematic views illustrating step 6 of the method for manufacturing a TFT substrate according to the present invention.
Figure 15:
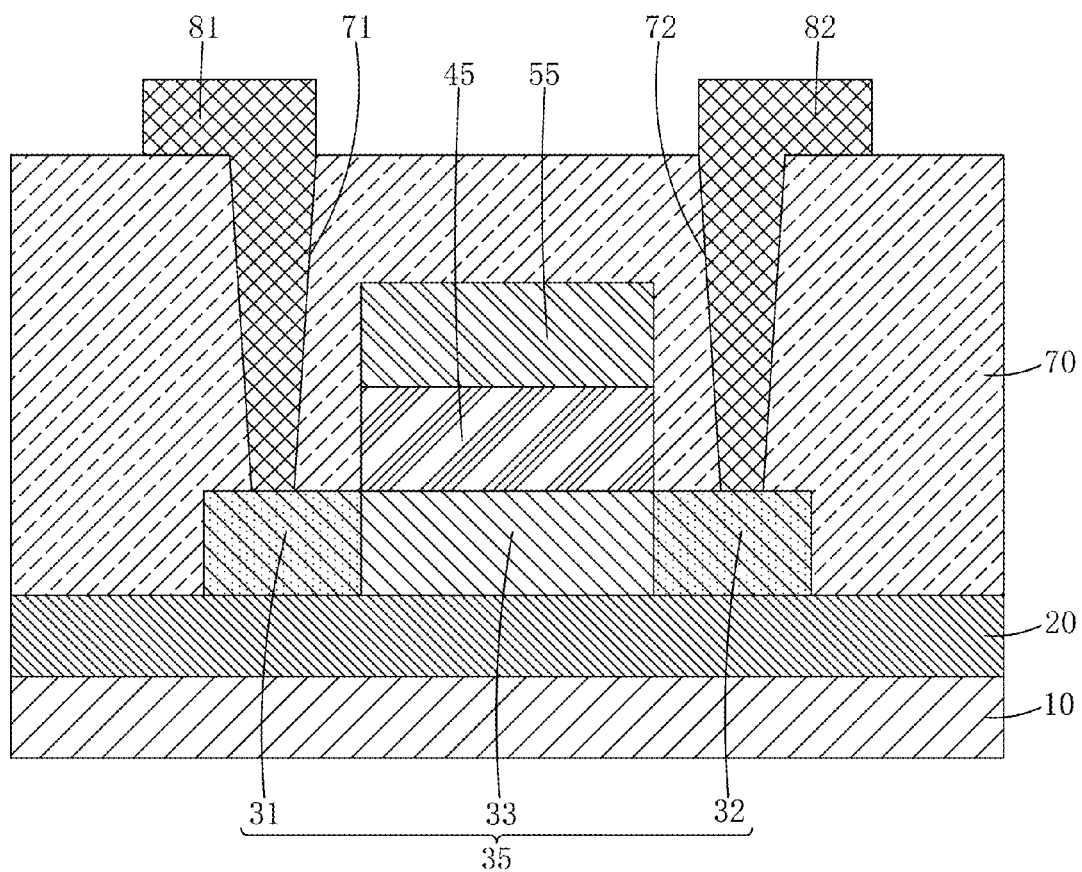

Step 6: as shown in FIG. 14-15, depositing a source/drain metal layer 80 on the interlayer dielectric layer 70, subjecting the source/drain metal layer 80 to patterning treatment by using one mask so as to form a source electrode 81 and a drain electrode 82, wherein the source electrode 81 and the drain electrode 82 are respectively in contact engagement with the source contact zone 31 and the drain contact zone 32 of the active layer 35 through the first via 71 and the second via 72 thereby forming a TFT substrate.

Specifically, the gate insulation layer 45 is formed of a material comprising silicon oxide.

Specifically, the gate electrode 55, the source electrode 81, and the drain electrode 82 are each formed of a material comprising one of molybdenum (Mo), titanium (Ti), aluminum (Al), and copper (Cu), or a stacked combination of multiple ones thereof.

Specifically, the TFT substrate formed in Step 6 is a top-gate self-alignment oxide semiconductor thin-film transistor substrate.

In summary, the present invention provides a method for manufacturing a TFT substrate, which uses one partial transmitting mask to form patterns of an active layer, a gate insulation layer, and a gate electrode through photolithography such that the entire process for manufacturing TFT substrate can be completely conducted by using only three masks. Compared to the prior art, one mask is save so that the operation is simplified and the manufacturing cost is reduced.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor (TFT) substrate, comprising the following steps:

(1) providing a base plate and depositing, in sequence, a buffer layer, a semiconductor layer, an insulation layer, and a gate metal layer on the base plate;

(2) coating a layer of photoresist material on the gate metal layer and subjecting the layer of photoresist material to patterning treatment by using a partial transmitting mask so as to form a center-raised-side-recessed photoresist layer, wherein the photoresist layer comprises a first photoresist segment located at a central portion and second photoresist segments respectively located at two opposite sides of the first photoresist segment with a thickness of the first photoresist segment being greater than a thickness of the second photoresist segments;

(3) applying a first etching operation to remove portions of the gate metal layer and the insulation layer that are not covered by the photoresist layer; and
applying a second etching operation to remove a portion of the semiconductor layer that is not covered by the photoresist layer to form an active layer;

(4) subjecting the photoresist layer to an ashing operation so as to thin the first photoresist segment and remove the second photoresist segments;
applying an etching operation to remove portions of the gate metal layer and the insulation layer that are not covered by the photoresist layer so as to form a gate electrode and a gate insulation layer; and
applying treatment to the active layer, with the photoresist layer, the gate electrode, and the gate insulation layer as a blocking layer, so as to enhance electrical conductivity of portions of the active layer that are not covered by the gate electrode and the gate insulation layer to form a source contact zone, a drain contact zone, and a channel zone that is located between the source contact zone and the drain contact zone;

(5) removing a remaining portion of the photoresist layer and depositing an interlayer dielectric layer on the gate electrode, the active layer, and the buffer layer and subjecting the interlayer dielectric layer to patterning treatment by using one mask so as to form, in the interlayer dielectric layer, a first via and a second via respectively corresponding to the source contact zone and the drain contact zone; and (6) depositing a source/drain metal layer on the interlayer dielectric layer, subjecting the source/drain metal layer to patterning treatment by using one mask so as to form a source electrode and a drain electrode, wherein the source electrode and the drain electrode are respectively in contact engagement with the source contact zone and the drain contact zone of the active layer through the first via and the second via thereby forming a TFT substrate.

2. The method for manufacturing a TFT substrate as claimed in claim 1, wherein in step (2), the thickness of the first photoresist segment is 1.5-3 µm and the thickness of the second photoresist segments is 0.15-1 µm.

3. The method for manufacturing a TFT substrate as claimed in claim 1, wherein in step (2), the photoresist material is a positive photoresist and the partial transmitting mask comprises a non-light-transmitting zone corresponding to the first photoresist segment and partial light-transmitting zones respectively corresponding to the second photoresist segments.

4. The method for manufacturing a TFT substrate as claimed in claim 1, wherein in step (2), the partial transmitting mask is a gray tone mask or a half tone mask.

5. The method for manufacturing a TFT substrate as claimed in claim 1, wherein in step (3), the first etching operation is a dry etching operation and the second etching operation is a wet etching operation; and in step (4), the etching operation is a dry etching operation.

6. The method for manufacturing a TFT substrate as claimed in claim 1, wherein in step (4), the treatment applied to the semiconductor layer is irradiation with ultraviolet light or plasma treatment.

7. The method for manufacturing a TFT substrate as claimed in claim 6, wherein the plasma comprises hydrogen, ammonia, or argon plasma.

8. The method for manufacturing a TFT substrate as claimed in claim 1, wherein in step (1), the base plate is first washed and cleaned before the buffer layer is deposited on the base plate.

9. The method for manufacturing a TFT substrate as claimed in claim 1, wherein in step (1), a material of the semiconductor layer is amorphous indium gallium zinc oxide and the semiconductor layer is formed through deposition in room temperature with sputtering equipment.

10. The method for manufacturing a TFT substrate as claimed in claim 1, wherein the base plate comprises a glass plate; the buffer layer and the interlayer dielectric layer are each a silicon oxide layer, a silicon nitride layer, or a composite layer formed of a silicon oxide layer and a silicon nitride layer stacked on each other; the gate insulation layer is formed of a material comprising silicon oxide; the gate electrode, the source electrode, and the drain electrode are each formed of a material comprising one of molybdenum, titanium, aluminum, and copper, or a stacked combination of multiple ones thereof.

* * * * *